US009927498B2

(12) United States Patent
Elian et al.

(10) Patent No.: US 9,927,498 B2
(45) Date of Patent: Mar. 27, 2018

(54) MAGNETIC SENSOR DEVICE COMPRISING A RING-SHAPED MAGNET AND A SENSOR CHIP IN A COMMON PACKAGE (71) Applicant: Infineon Technologies AG, Neubiberg (DE)

(72) Inventors: Klaus Elian, Alteglofsheim (DE); Horst Theuss, Wenzenbach (DE); Alexander Spielbauer, Ergoldsbach (DE); Ingrid Bollmann, Etterzhausen (DE)

(73) Assignee: Infineon Technologies AG, Neubiberg (DE)

( * ) Notice: Subject to any disclaimer, the term of this patent is extended or adjusted under 35 U.S.C. 154(b) by 234 days.

(21) Appl. No.: 14/297,685

(22) Filed: Jun. 6, 2014

(65) Prior Publication Data
US 2015/0355291 A1 Dec. 10, 2015

(51) Int. Cl.
*G01R 33/06* (2006.01)
*G01R 33/00* (2006.01)

(52) U.S. Cl.
CPC ......... *G01R 33/06* (2013.01); *G01R 33/0052* (2013.01); *Y10T 29/49021* (2015.01)

(58) Field of Classification Search
CPC ............... G01R 33/0052; G01R 33/06; Y10T 29/49021
USPC ............. 324/207.2, 207.21, 207.24, 207.25
See application file for complete search history.

(56) References Cited

U.S. PATENT DOCUMENTS

| 3,230,434 | A | * | 1/1966 | Bauerlein | H02K 29/08 310/10 |
| 5,637,995 | A | * | 6/1997 | Izawa | G01D 5/145 324/174 |
| 5,698,778 | A | * | 12/1997 | Ban | F02D 11/106 324/207.2 |
| 5,998,989 | A | * | 12/1999 | Lohberg | G01P 3/487 324/174 |
| 6,087,827 | A | * | 7/2000 | Oudet | G01R 33/06 219/121.68 |
| 6,130,535 | A | * | 10/2000 | Herden | G01D 5/145 324/207.2 |
| 6,326,780 | B1 | * | 12/2001 | Striker | G01R 33/0011 324/207.2 |
| 6,356,073 | B1 | * | 3/2002 | Hamaoka | G01D 5/145 324/207.2 |
| 7,259,554 | B2 | * | 8/2007 | Wiese | G01D 5/14 324/207.2 |

(Continued)

FOREIGN PATENT DOCUMENTS

CN 103090891 A 5/2013
CN 103376424 A 10/2013
(Continued)

*Primary Examiner* — Jay Patidar
(74) *Attorney, Agent, or Firm* — Murphy, Bilak & Homiller, PLLC (57) ABSTRACT

In one implementation, a magnetic sensor device used for sensing a static or dynamic magnetic field includes a ring-shaped magnet, a sensor chip arranged in an opening of the ring-shaped magnet, and a leadframe, with the ring-shaped magnet and the sensor chip directly disposed on the leadframe. The sensor chip may further include a carrier with a stepwise configuration having two or more different planes with the ring-shaped magnet and the sensor chip disposed on different planes.

15 Claims, 7 Drawing Sheets

(56) References Cited

U.S. PATENT DOCUMENTS

| | | | | |
|---|---|---|---|---|
| 7,385,394 B2* | 6/2008 | Auburger | G01P 3/488 324/207.25 |
| 7,408,344 B2* | 8/2008 | Tokuhara | G01D 5/00 324/207.21 |
| 8,624,586 B2* | 1/2014 | Dordet | G01D 5/145 324/207.2 |
| 8,766,625 B2* | 7/2014 | Mehnert | G01D 5/145 324/207.15 |
| 2004/0130314 A1* | 7/2004 | Bossoli | G01P 3/488 324/174 |
| 2004/0263156 A1* | 12/2004 | Buchhold | G01D 5/145 324/207.21 |
| 2006/0238190 A1* | 10/2006 | Ishio | G01D 5/06 324/207.21 |
| 2006/0238199 A1 | 10/2006 | Larsen | |
| 2006/0244441 A1* | 11/2006 | Ramsden | G01D 5/145 324/207.22 |
| 2007/0018642 A1* | 1/2007 | Ao | G01D 5/145 324/252 |
| 2007/0120555 A1* | 5/2007 | Tokuhara | G01D 5/00 324/207.21 |
| 2008/0136405 A1* | 6/2008 | Cochran | G01D 5/145 324/207.11 |
| 2009/0153138 A1* | 6/2009 | Theuss | B82Y 25/00 324/251 |
| 2010/0060267 A1* | 3/2010 | Wagner | G01D 5/145 324/207.2 |
| 2010/0295140 A1* | 11/2010 | Theuss | B82Y 25/00 257/421 |
| 2011/0001470 A1* | 1/2011 | Monteil | G01D 5/145 324/207.2 |
| 2012/0319682 A1* | 12/2012 | Ausserlechner | G01R 33/072 324/252 |
| 2013/0241537 A1* | 9/2013 | Hammerschmidt | B82Y 25/00 324/207.21 |
| 2013/0249029 A1* | 9/2013 | Vig | G01R 33/0047 257/427 |
| 2013/0249544 A1* | 9/2013 | Vig | G01R 33/0011 324/252 |
| 2013/0267043 A1* | 10/2013 | Ararao | G01R 33/0047 438/3 |
| 2014/0266181 A1* | 9/2014 | Milano | G01R 31/2884 324/251 |
| 2015/0022193 A1* | 1/2015 | Burdette | G01N 27/72 324/239 |
| 2015/0061069 A1* | 3/2015 | Friedrich | H01L 28/91 257/506 |
| 2015/0137796 A1* | 5/2015 | Ausserlechner | G01B 7/30 324/207.2 |

FOREIGN PATENT DOCUMENTS

| | | | |
|---|---|---|---|
| JP | 09079865 A | * | 3/1997 |
| JP | 2004294070 A | * | 10/2004 |
| JP | 2006-277048 | * | 3/2006 |

* cited by examiner

MAGNETIC SENSOR DEVICE COMPRISING A RING-SHAPED MAGNET AND A SENSOR CHIP IN A COMMON PACKAGE

TECHNICAL FIELD

The present invention relates to a magnetic sensor device and a method for fabricating a magnetic sensor device.

BACKGROUND

Magnetic sensor devices can, for example, be configured to measure the speed of a magnetic tooth wheel. Such magnetic speed sensors typically include an integrated circuit with a plurality of magnetic sensor elements, such as Hall sensor elements or magneto resistive (XMR) elements, as for example Giant magneto resistive (GMR) sensor elements or anisotrope magneto resistive (AMR) sensor elements. A permanent magnet provides a bias magnetic field to the sensor elements. As the wheel is rotated, the teeth of the wheel pass in front of the sensor and generate a small field variation, which is detected by the sensor and processed by the integrated circuit. The detected field contains information about the angular position and rotational speed of the wheel. With respect of the fabrication of such magnetic sensor devices there is a steady demand towards reducing or simplifying fabrication steps, in particular reducing pick-and-place steps or mold steps. Another steady demand relates to the size of the magnetic sensor device package and to the variability of the shape of the permanent magnet as it can be desirable to provide the permanent magnet with a specific shape so as to provide the permanent magnetic field with a particular desired field distribution.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

In several embodiments layers or layer stacks are applied to one another or materials are applied or deposited onto layers or other substrates. It should be appreciated that any such terms as "applied" or "deposited" are meant to cover literally all kinds and techniques of applying layers or materials onto substrates. In particular, they are meant to cover techniques in which layers or materials are applied at once as a whole like, for example, laminating techniques as well as techniques in which layers or materials are deposited in a sequential manner like, for example, sputtering, plating, molding, CVD, etc.

Embodiments as described herein comprise magnetic sensor chips. The magnetic sensor chips may comprise contact elements or contact pads on one or more of their outer surfaces wherein the contact elements serve for electrically contacting the magnetic sensor chips. The contact elements may have any desired form or shape. They can, for example, have the form of lands, i.e. flat contact layers on an outer surface of the semiconductor package. The contact elements or contact pads may be made from any electrically conducting material, e.g. from a metal as aluminum, gold, or copper, for example, or a metal alloy, or an electrically conducting organic material, or an electrically conducting semiconductor material.

In the claims and in the following description different embodiments of a method for fabricating a magnetic sensor device are described as a particular sequence of processes or measures, in particular in the flow diagrams. It is to be noted that the embodiments should not be limited to the particular sequence described. Particular ones or all of different processes or measures can also be conducted simultaneously or in any other useful and appropriate sequence.

In the following several embodiments are presented in which a magnetic sensor chip is used and intended for sensing a static or dynamic magnetic field. It is to be noted that the magnetic sensor chip can be constructed in different ways and can work along different measurement principles. The magnetic sensor chip can, for example, comprise a Hall sensor element. Alternatively, the magnetic sensor chip can comprise a magneto resistive (XMR) sensor element. Also other implementations of a magnetic sensor chip can be employed by the skilled person.

Figure 1:
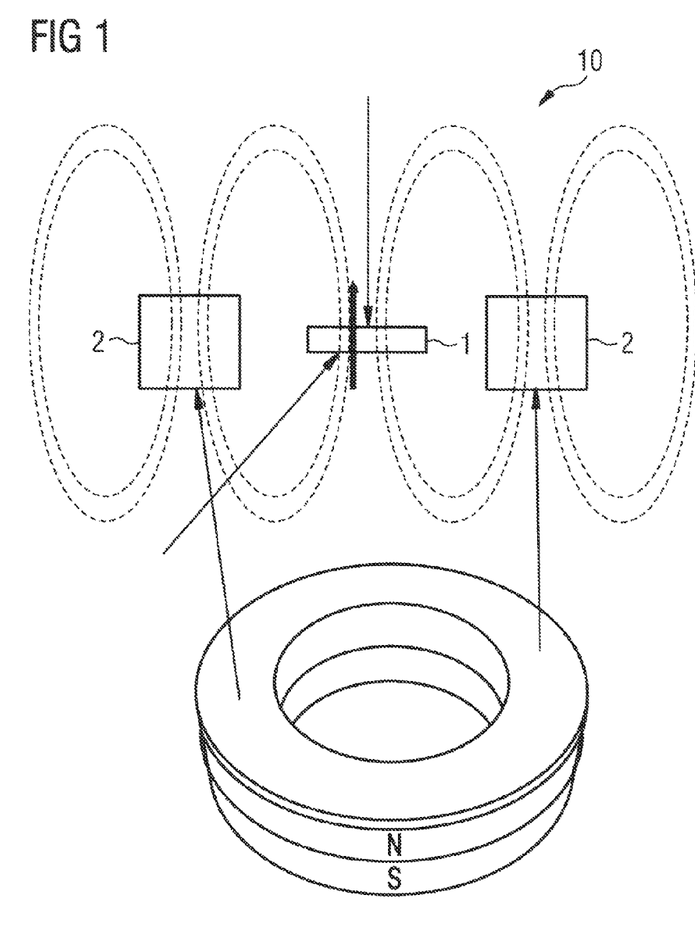
FIG. 1 shows a schematic side view representation of an exemplary magnetic sensor device (upper part) and an exemplary ring-shaped magnet (lower part) thereof.

Referring to FIG. 1, there is shown in the upper part a schematic cross-sectional side view representation of a magnetic sensor device 10 according to an example, and in the lower part a ring-shaped magnet as part of the magnetic sensor device 10 according to an example. The magnetic sensor device 10, as shown in FIG. 1, comprises a ring-shaped magnet 1 and a sensor chip 2 arranged in an opening of the ring-shaped magnet 1. The ring-shaped magnet serves for generating a magnetic bias field and may comprise a permanent magnet.

FIG. 1 illustrates an important aspect of the disclosure. The magnetic bias field as generated by the ring-shaped magnet 1 is shown as the dashed lines. It can be seen that due to the arrangement of the sensor chip 2 spatially relative to the ring-shaped magnet 1, the magnetic field lines of the magnetic bias field are perpendicular to the main surfaces of the sensor chip 2 at least in a center region of the sensor chip 2. This is an important result, as in measurement applications of the sensor device components of the bias magnetic field parallel to the main surfaces may lead to measurement errors.

The ring-shaped magnet, as shown in FIG. 1, is represented as having a north pole and a south pole which is only intended to symbolize the magnetization direction top-down and parallel to the cylinder axis of the ring-shaped magnet 1.

The ring-shaped magnet 1 of FIG. 1 comprises a circular ring. It is, however, also possible for the ring-shaped magnet 1 to comprise one or more of a quadratic ring, a rectangular ring, and a polygonal ring. It is also possible that the outer contour of the ring is different from the inner contour so that e.g. a magnetic formed as a quadrat or a rectangle may comprise a circular or oval opening.

The ring-shaped magnet 1, as shown in FIG. 1, comprises a closed ring. It is, however, also possible for the ring-shaped magnet to comprise an open ring which means that the ring may be interrupted at one or more positions. The ring-shaped magnet may thus comprise an open ring comprising two or more ring segments.

The arrangement of the ring-shaped magnet 1 and the sensor chip 2, as shown in FIG. 1, is such that a symmetry axis of the ring-shaped magnet 1 is identical with a symmetry axis of the sensor chip 2. The symmetry axis of both is a rotational or cylinder axis of the magnetic sensor device 10. This means that the sensor chip 2 is disposed in a center of the opening in a horizontal direction. The arrangement, as shown in FIG. 1, also shows that the sensor chip 2 is arranged in the center of the opening in a vertical direction.

According to an example, the magnetic sensor device may further comprise a carrier, wherein one or more of the ring-shaped magnet and the sensor chip are disposed on the carrier. The carrier can be configured as a conductive carrier like, for example, a leadframe. The sensor chip may be electrically connected to the carrier by means of wire-bonding. The sensor chip may also be electrically connected to the carrier in a flip-chip configuration by means of solder balls as interconnects.

The carrier may also be configured as a board like a printed circuit board (PCB), or as a plate fabricated of ceramics or laminates.

The carrier may be flat or it may comprise a stepwise configuration with two or more different planes. In the latter case the ring-shaped magnet and the sensor chip may be disposed on different planes. This would allow to dispose the sensor chip in the center of the opening of the ring-shaped magnet in the vertical direction.

According to an example, the magnetic sensor device of FIG. 1 may further comprise an encapsulation material arranged to encapsulate the ring-shaped magnet and the sensor chip. The encapsulation material may comprise or consist of one or more of a resin material, in particular an epoxy resin material, any sort of a polymer-based material, or any sort of an UV curable material. In case of the use of a carrier for supporting one or more of the ring-shaped magnet and the sensor chip, the carrier may also be encapsulated by the encapsulation material. If a leadframe is used as a carrier, parts of it may extend outside the encapsulation material body for use as external contact pins to connect the magnetic sensor device to, for example, a printed circuit board.

According to an example, the magnetic sensor device may further comprise one further ring-shaped magnet. This further ring-shaped magnet may be formed identical with the actual ring-shaped magnet. Besides that a symmetry axis of this further ring-shaped magnet may be identical with a symmetry axis of the sensor chip and possible also with the actual ring-shaped magnet. The whole arrangement comprising the sensor chip and the two ring-shaped magnets may be cylinder symmetric with respect to one common symmetry axis. In case of the use of a carrier, one ring-shaped magnet may be applied to one main face of the carrier and the other ring-shaped magnet may be applied to the other opposite main face of the carrier. The sensor chip may be applied to one of the main faces of the carrier. The sensor chip may be wire-bonded to the carrier or, in case of a leadframe, to a specific part of the leadframe.

According to an example of the magnetic sensor device, the sensor chip comprises one of a Hall sensor and a magneto resistive, in particular a giant magneto resistive (GMX) sensor.

According to an example, the magnetic sensor device further comprises a redistribution layer, wherein one or more of the ring-shaped magnet and the sensor chip are disposed on the redistribution layer and a plurality of contact elements are disposed on the redistribution layer. The redistribution layer may be configured in such a way that it effects a fan-out of the electrical contacts of the sensor chip which means that electrical contact pads of the sensor chip are connected with external contact elements located outside of the boundaries of the sensor chips. The external contact elements may have the form of solder balls or flat contact areas.

Figure 2:
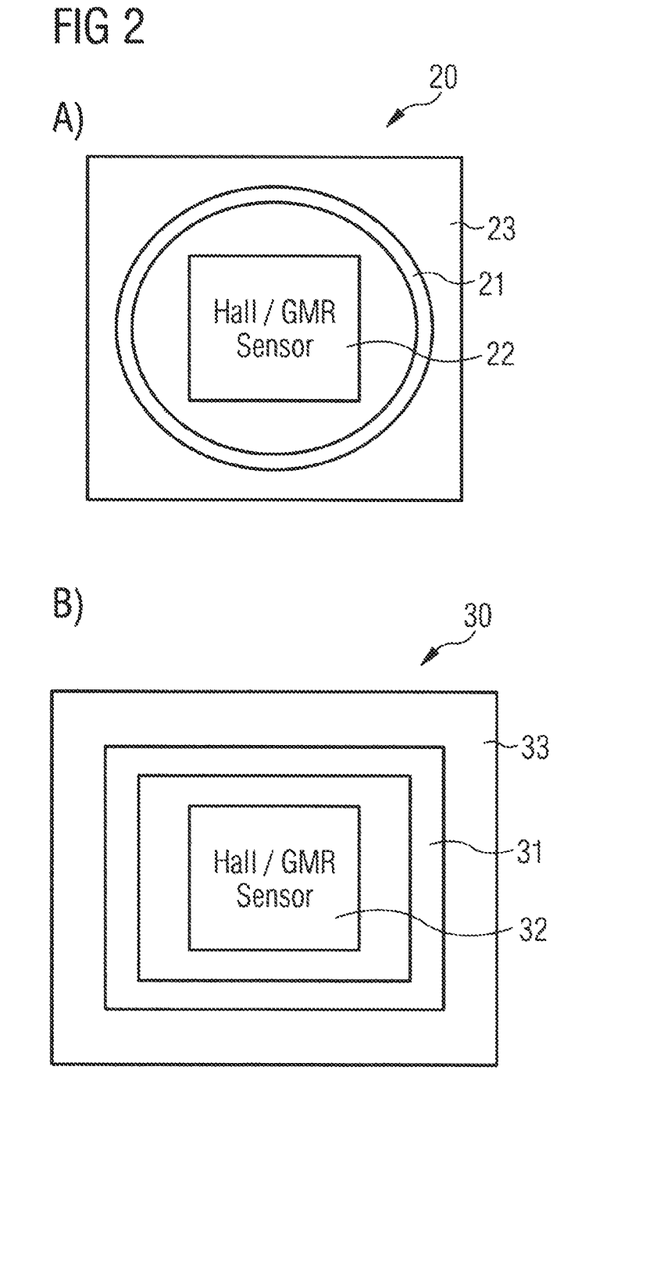
FIGS. 2A-2F show top view representations of an exemplary magnetic sensor device with a circular ring-shaped magnet (2A), an exemplary magnetic sensor device with a rectangular ring-shaped magnet (2B), an exemplary magnetic sensor device with a polygonal ring-shaped magnet (2C), an exemplary magnetic sensor device with a quadratic ring-shaped magnet (2D), an exemplary magnetic sensor device wherein the ring-shaped magnet comprises two ring segments (2E) and an exemplary magnetic sensor device wherein the ring-shaped magnet comprises more than two ring segments (2F).

Referring to FIGS. 2A and 2B, there are shown top view representations of examples of magnetic sensor devices. FIG. 2A shows a magnetic sensor device 20 comprising a ring-shaped magnet 21 and a sensor device 22 arranged in an opening of the ring-shaped magnet 21. The ring-shaped magnet 21 comprises a circular or slightly oval ring-shape. The sensor chip 22 is shown to be disposed in the center of the opening of the ring-shaped magnet 21 as far as the horizontal direction is concerned. This means that a cylindrical symmetry axis of the ring-shaped magnet 21 and a cylindrical symmetry axis of the sensor chip 22 fall together or are identical with each other. With respect to the vertical direction the sensor chip 22 can also be disposed in a center of the opening of the ring-shaped magnet 21 or can also be displaced from the center position as will be shown in examples further below. The magnetic sensor device 20 may further comprise an encapsulation material 23 formed and arranged to encapsulate the ring-shaped magnet 21 and the sensor chip 22. The encapsulation material 23 may be formed to a body having a quadratic or rectangular main face wherein the body may comprise a cube or cuboid form or other forms which will be shown in examples further below.

FIG. 2B shows a magnetic sensor device 30 comprising a ring-shaped magnet 31 and a sensor chip 32 arranged in an opening of the ring-shaped magnet 31. The ring-shaped magnet 31 comprises a rectangular contour wherein the outer contour as well as the inner contour of the ring are rectangular in shape which means that the opening of the magnet 31 is rectangular in cross-section. Also in this example of a magnetic sensor device 30, the sensor chip 32 is disposed in the center of the opening of the magnet 31, at least in a horizontal direction and possibly also in a vertical direction. The magnetic sensor device 30 may also comprise an encapsulation material 33 arranged to encapsulate the ring-shaped magnet 31 and the sensor chip 32. The encapsulation material 33 can be formed to a material body in the same way as it was described in connection with the example of FIG. 2A with respect to encapsulation material 23.

According to an example of the magnetic sensor device, the ring-shaped magnet may comprise a ring having equal diameter along the entire perimeter of the ring. The examples of a magnetic sensor device as shown in FIGS. 2A and B show ring-shaped magnets 21 and 31 having equal diameter along their entire perimeter. It is, however, also possible to have ring-shaped magnets having variable or varying diameters along their perimeter. This may, for example, occur in cases in which the outer contour of the ring is different from the inner contour of the ring as already explained above. FIG. 2C shows a magnetic sensor device comprising a polygonal ring-shaped magnet 21.1. FIG. 2D shows a magnetic sensor device comprising a quadratic ring-shaped net 21.2. FIG. 2E shows a magnetic sensor device wherein the ring-shaped magnet 21.3 is comprised of two ring segments. FIG. 2F shows a magnetic sensor device wherein the ring-shaped magnet 21.4 is comprised of more than two ring segments.

Referring to FIGS. 3A-D, there are shown schematic cross-sectional side view representations of examples of magnetic sensor devices.

Figure 3:
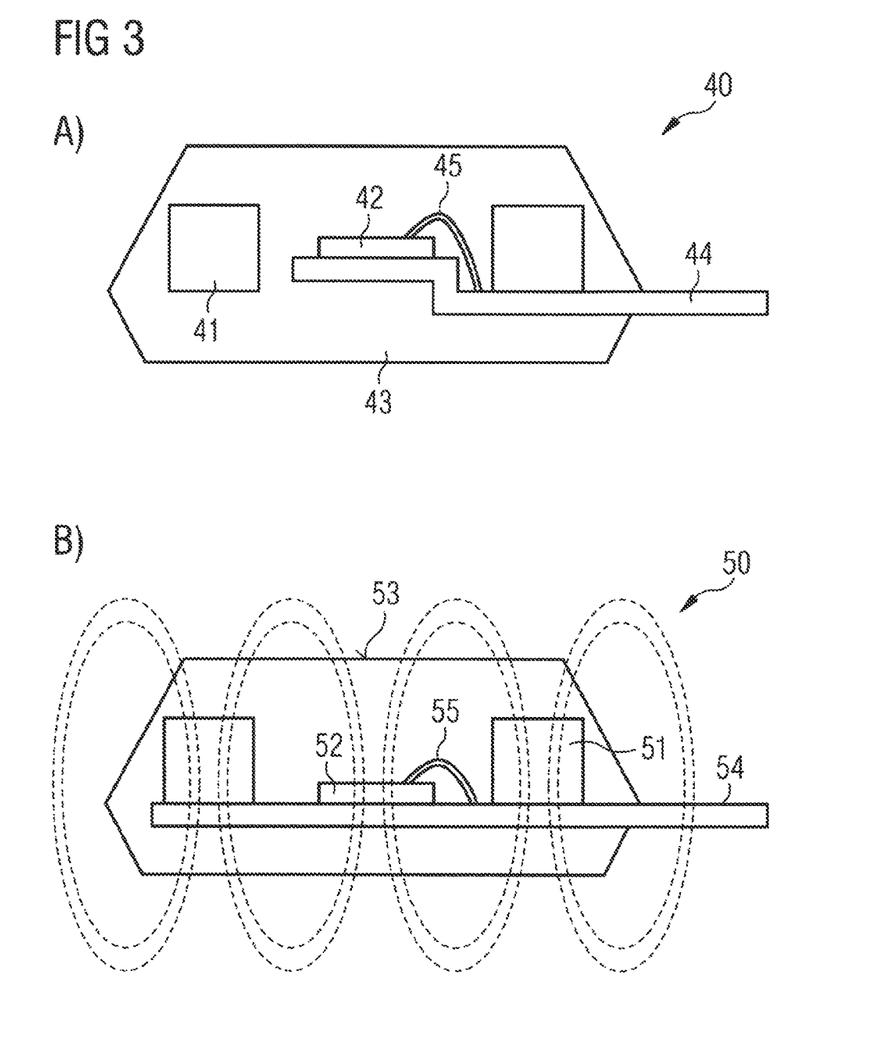
FIGS. 3A-D show schematic cross-sectional side view representations of exemplary magnetic sensor devices, in particular a magnetic sensor device comprising a stepped leadframe (3A), a magnetic sensor device comprising a flat leadframe (3B), a magnetic sensor device comprising two leadframe sections (3C), and a magnetic sensor devise comprising two ring-shaped magnets.

FIG. 3A shows a magnetic sensor device 40 comprising a ring-shaped magnet 41, a sensor chip 42, an encapsulation material 43, a leadframe 44, and a wire bond 45. The leadframe 44 comprises a stepped configuration comprising two parts disposed in different planes and separated by a kink or sharp bend. The ring-shaped magnet 41 can be disposed on a lower part of the leadframe 44 and the sensor device 42 can be disposed on an upper part of the leadframe 44. The sensor device 42 can be connected to the leadframe 44, in particular to the lower part of the leadframe 44 by the wire bond 45. The lower part of the leadframe 44 extends to the outside of the device and may serve as an external contact pin. Due to the arrangement of the ring-shaped magnet 41 and the sensor device 42 on different planes of the leadframe 44 it is possible to locate the sensor device 42 in a central position of the opening of the ring-shaped magnet 41 with respect to the vertical direction. The encapsulation material 43 is formed to a material block in such a way that in the cross-section, as shown in FIG. 3A, the material block has a trapezoidal shape.

The magnetic sensor device 40, as shown in FIG. 3A, may be fabricated by providing a leadframe 44, bending the leadframe 44 so that it comprises two parts disposed in different planes, placing the ring-shaped magnet 41 on the lower part of the leadframe 44 and the sensor chip 42 on the upper part of the leadframe 44 by, for example, fixing with glue or solder, making an electrical connection between the sensor chip 42 and the leadframe 44 by use of the wire bond 45, and finally over-molding the structure with the encapsulation material 43. In this way it is possible to fabricate a single magnetic sensor device.

FIG. 3B shows an example of a magnetic sensor device 50 which comprises a ring-shaped magnet 51, a sensor chip 52, an encapsulation material 53, a leadframe 54, and a wire bond 55. The only difference with respect to the magnetic sensor device 40 of FIG. 3A is that the leadframe 54 is flat so that it does not provide different planes to dispose the magnet 51 and the sensor chip 52. As a result, the sensor chip 52 is disposed in a central position of the opening of the ring-shaped magnet 51 in a horizontal direction but slightly displaced from the central position in a vertical direction which is, however, of no significant influence as the field lines of the magnetic bias field are still perpendicular to the main surfaces of the sensor chip 52.

FIG. 3C shows an example of a magnetic sensor device 60 which comprises a first ring-shaped magnet 61, a sensor chip 62, an encapsulation material 63, a leadframe 64, a wire bond 65, and a second ring-shaped magnet 66. The only difference with respect to the magnet sensor device 50 of FIG. 3B is that a second ring-shaped magnet 66 is provided which is applied to the leadframe 64 in an opposite relationship to the first ring-shaped magnet 61. Both magnets 61 and 66 are thus arranged symmetrical to each other with the leadframe 64 as the symmetry plane. Providing a second ring-shaped magnet 66 may enhance the sensitivity of the magnetic sensor device as it doubles the magnetic field strength at the main surfaces of the sensor chip 62.

FIG. 3D shows an example of a magnetic sensor device 70 comprising a ring-shaped magnet 71, a sensor chip 72, an encapsulation material 73, a leadframe 74 comprising a first leadframe portion 74.1 and a second leadframe portion 74.2, and solder balls 75 used for electrically connecting the sensor chip 72 to the leadframe 74. The only difference between the magnetic sensor device 70 and the magnetic sensor device 50 of FIG. 3B is that the leadframe 74 comprising two parts, namely the first part 74.1 and the second part 74.2 wherein both parts 74.1 and 74.2 extend to the outward to serve as external contact pins and that the sensor chip 72 is electrically connected with one contact element 75 to the first part 74.1 and with a second contact element 75 to the second part 74.2.

The examples of magnetic sensor devices as shown in FIGS. 3A-C comprise sensor chips 42, 52 and 62 disposed in such a way that their upper main face of two opposing main faces is the active surface so that electrical contact between the upper surface and the respective leadframe is accomplished by a wire bond. In contrast to this, the magnetic sensor device, as shown in FIG. 3D, comprises the sensor chip 72 in a flip-chip arrangement in which the active surface is the lower main face of the two opposing main faces of sensor chip 72 so that electrical contact between electrical contact pads of the active surface of sensor chip 72 and leadframe 74 is accomplished by solder balls. 75

Figure 4:
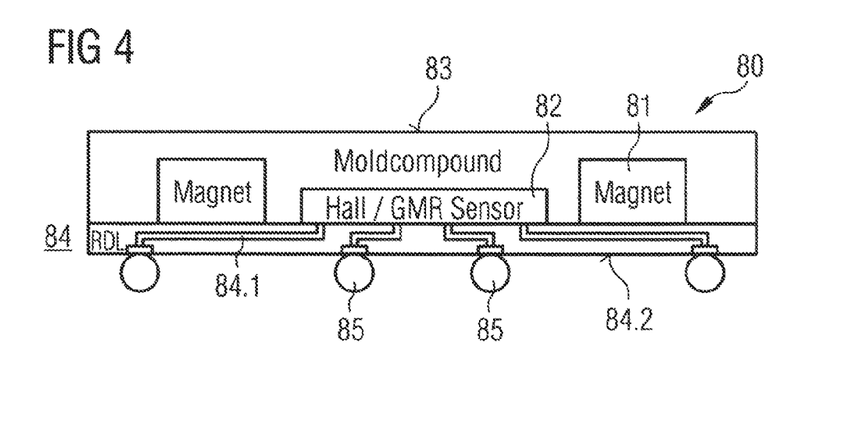
FIG. 4 shows a schematic cross-sectional side view representation of an exemplary magnetic sensor device comprising a redistribution layer.

Referring to FIG. 4, there is shown a schematic cross-sectional side view representation of a magnetic sensor device according to an example. The magnetic sensor device 80 of FIG. 4 comprises a ring-shaped magnet 81, a sensor chip 82, an encapsulation material 83, a redistribution layer 84, and a plurality of solder balls 85. The sensor chip 82 is disposed in such a way that its active surface is the lower main face of the two opposing main faces so that electrical contact elements of the sensor chip 82 are facing towards the redistribution layer 84. The redistribution layer 84 mainly comprises a dielectric layer 84.1 and electrical traces 84.2 embedded therein and connecting electrical contact pads of the active surface of sensor chip 82 with external solder balls 85. The redistribution layer 84 may be configured in such a way that it provides a fan-out of the electrical connections which means that the electrical connections are distributed over an area which is larger than the area of the active surface of the sensor device 82 or the area covering the electrical contact pads on the active surface.

The present disclosure is also related to a method for fabricating a magnetic sensor device. The method comprises fabricating a plurality of sensor chips, placing the sensor chips on a carrier, placing a ring-shaped magnet around each one of the sensor chips, attaching an encapsulation layer onto the sensor chips, removing the carrier, and singulating into a plurality of magnetic sensor devices.

The above method corresponds to an extended wafer level (EWL) technology which comprises fabricating a reconfigured wafer comprising essentially a carrier and a plurality of magnetic sensor devices applied thereon, and which allows fabricating a plurality of packaged magnetic sensor devices in parallel.

Figure 5:
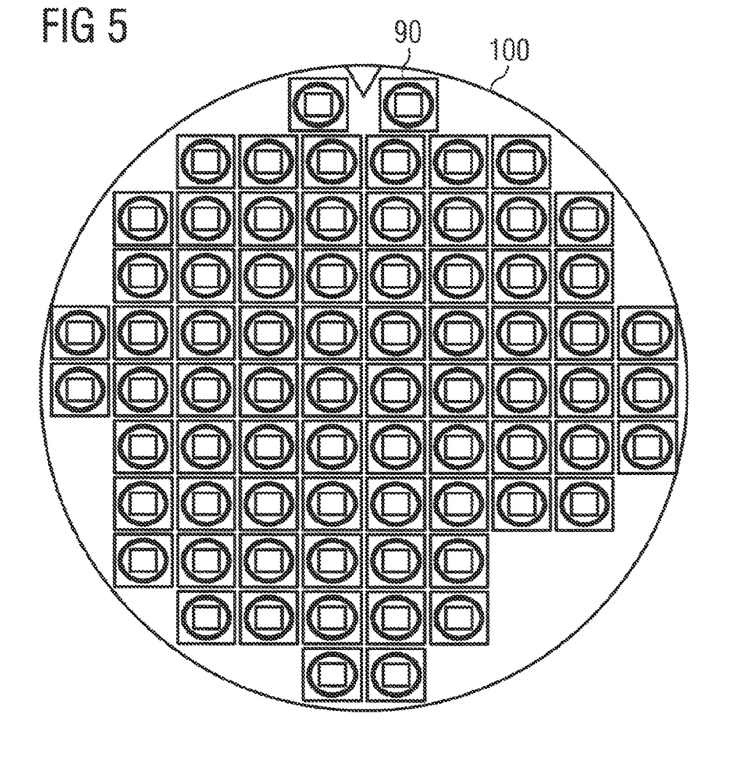
FIG. 5 shows a top view representation of a reconfigured wafer comprising a plurality of exemplary magnetic sensor devices for illustrating an exemplary method for fabricating a magnetic sensor device.

Referring to FIG. 5, there is shown a top view representation of a reconfigured wafer comprising a carrier 100 and a plurality of packaged magnetic sensor devices 90. The figure shows a stage of the method after the step of attaching the encapsulation layer to the sensor chips and the magnets. Thereafter the carrier will be removed and the panel will be singulated into single magnetic sensor devices.

According to an example of the method for fabricating a magnetic sensor device, a redistribution layer is applied to the sensor chips after removing of the carrier, and thereafter a plurality of contact elements, as for example solder balls, is applied to the redistribution layer. The redistribution layer may look like that shown in the example of FIG. 4 and described in more detail above. This kind of redistribution layer will be applied to the complete panel comprising the encapsulation layer covering the plurality of sensor chips surrounded each by a ring-shaped magnet. After applying the plurality of contact elements to the redistribution layer, the panel can be singulated into a plurality of magnetic sensor devices such as that shown in FIG. 4.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A magnetic sensor device, comprising:
   a ring-shaped magnet comprising an interface between a north pole and a south pole of the ring-shaped magnet;
   a sensor chip comprising a first main face and a second main face opposite to the first main face, wherein the first and second main faces are arranged in an opening of the ring-shaped magnet parallel to the interface; and
   a leadframe, wherein the ring-shaped magnet and the sensor chip are each directly disposed on the leadframe.

2. The magnetic sensor device according to claim 1, wherein
   the ring-shaped magnet comprises one or more of a circular ring, a quadratic ring, a rectangular ring, and a polygonal ring.

3. The magnetic sensor device according to claim 1, wherein
   the ring-shaped magnet comprises a closed ring or an open ring.

4. The magnetic sensor device according to claim 3, wherein
   the ring-shaped magnet comprises an open ring comprising two or more ring segments.

5. The magnetic sensor device according to claim 1, wherein
   a symmetry axis of the ring-shaped magnet is identical with a symmetry axis of the sensor chip.

6. The magnetic sensor device according to claim 1, further comprising a carrier comprising a stepwise configuration and wherein the ring-shaped magnet and the sensor chip are disposed on different planes.

7. The magnetic sensor device according to claim 1, further comprising:
   an encapsulation material arranged to encapsulate the ring-shaped magnet and the sensor chip.

8. The magnetic sensor device according to claim 1, wherein
   the ring-shaped magnet comprises a magnetization such that field lines of the magnetic field are perpendicular to a center portion of main faces of the sensor chip.

9. The magnetic sensor device according to claim 1, further comprising:
   one further ring-shaped magnet.

10. The magnetic sensor device according to claim 9, wherein:
    a symmetry axis of the further ring-shaped magnet is identical with a symmetry axis of the sensor chip.

11. A sensor device, comprising:
    a magnetic bias field generator comprising a through-opening and an interface between a north pole and a south pole of the magnetic bias field generator; and
    a sole semiconductor chip, wherein the sole semiconductor chip is a sensor chip comprising a sensor element, a first main face and a second main face opposite to the first main face, the first and second main faces being arranged within the through-opening of the magnetic bias field generator parallel to the interface.

12. The sensor device according to claim 11, wherein the magnetic bias field generator comprises a ring-shaped permanent magnet.

13. The sensor device according to claim 11, wherein the sensor chip comprises one of a Hall sensor and a magneto resistive sensor.

14. The sensor device according to claim 11, further comprising:
 a conductive carrier, wherein one or more of the magnetic bias field generator and the sensor chip are disposed on the carrier.

15. The sensor device according to claim 11, further comprising:
 a redistribution layer, wherein one or more of the magnetic bias field generator and the sensor chip are disposed on the redistribution layer; and
 a plurality of contact elements disposed on the redistribution layer.

* * * * *